(12) United States Patent
Ohde et al.

(10) Patent No.: US 7,880,317 B2
(45) Date of Patent: Feb. 1, 2011

(54) SEMICONDUCTOR DEVICE AND METHOD OF MANUFACTURING SEMICONDUCTOR DEVICE

(75) Inventors: Tomoshi Ohde, Kanagawa (JP); Fujio Kanayama, Oita (JP); Mitsuru Adachi, Kanagawa (JP); Tetsunori Niimi, Kanagawa (JP); Hidetoshi Kusano, Oita (JP); Yuji Nishitani, Kanagawa (JP)

(73) Assignees: Sony Corporation, Tokyo (JP); Sony Computer Entertainment Inc., Tokyo (JP)

( * ) Notice: Subject to any disclaimer, the term of this patent is extended or adjusted under 35 U.S.C. 154(b) by 438 days.

(21) Appl. No.: 12/094,314

(22) PCT Filed: Oct. 30, 2006

(86) PCT No.: PCT/JP2006/321672

§ 371 (c)(1),
(2), (4) Date: May 20, 2008

(87) PCT Pub. No.: WO2007/060812

PCT Pub. Date: May 31, 2007

(65) Prior Publication Data

US 2009/0302450 A1    Dec. 10, 2009

(30) Foreign Application Priority Data

Nov. 22, 2005    (JP) ............................. 2005337874

(51) Int. Cl.
*H01L 23/28*    (2006.01)
*H01L 21/00*    (2006.01)

(52) U.S. Cl. ..................................... 257/787; 438/126

(58) Field of Classification Search ................. 257/787, 257/791, 792, 793; 438/112, 124, 126, 127
See application file for complete search history.

(56) References Cited

U.S. PATENT DOCUMENTS

| | | | |
|---|---|---|---|
| 6,214,643 B1 * | 4/2001 | Chiu | 438/108 |
| 2002/0017738 A1 | 2/2002 | Miyajima | |
| 2002/0190396 A1 * | 12/2002 | Brand | 257/787 |
| 2004/0159961 A1 * | 8/2004 | Mensch et al. | 257/787 |
| 2004/0262781 A1 * | 12/2004 | Germain et al. | 257/787 |
| 2005/0093178 A1 * | 5/2005 | Huang et al. | 257/787 |

(Continued)

FOREIGN PATENT DOCUMENTS

JP    2001-308258    11/2001

(Continued)

OTHER PUBLICATIONS

Taiwanese Office action dated Sep. 24, 2009, from the corresponding Taiwanese Application.

(Continued)

*Primary Examiner*—S. V Clark
(74) *Attorney, Agent, or Firm*—Katten Muchin Rosenman LLP

(57) ABSTRACT

A semiconductor device is provided in which the heat dissipation characteristic of a flip-chip mounted semiconductor chip is improved. A semiconductor device is provided with a substrate, a semiconductor flip-chip mounted on the substrate, a sealing resin layer for sealing around the semiconductor flip-chip. A sealing resin layer for sealing the semiconductor chip is formed around the semiconductor chip. In this semiconductor device, the back surface of the semiconductor chip is exposed and is convex with respect to the upper surface of the sealing resin layer.

12 Claims, 16 Drawing Sheets

U.S. PATENT DOCUMENTS

2005/0151272 A1* 7/2005 Street et al. .................. 257/787
2006/0108700 A1* 5/2006 Nakazawa et al. ........... 257/787
2007/0132112 A1* 6/2007 Ozaki et al. .................. 257/787

FOREIGN PATENT DOCUMENTS

JP          2002-009096         1/2002
JP          2002-026194         1/2002

OTHER PUBLICATIONS

International Search Report and Written Opinion of the International Searching Authority dated Jan. 23, 2007 for corresponding International Patent Application PCT/JP2006/321672.

International Preliminary Examination on Patentability for corresponding International Patent Application PCT/JP2006/321672.

* cited by examiner

10a

12

10

10a

SEMICONDUCTOR DEVICE AND METHOD OF MANUFACTURING SEMICONDUCTOR DEVICE

TECHNICAL FIELD

The present invention relates to a semiconductor device in which a semiconductor chip mounted on a substrate is sealed by a sealing resin.

BACKGROUND ART

Recently, with the trend toward miniaturization, high performance and high speed operation of electronic devices such as computers, cell phones, and personal digital assistants, there is a demand for further size reduction, higher speed, and higher density of semiconductor devices carrying a semiconductor chip (IC, LSI) and used in electronic devices. Reduction in size and increase in speed and density of a semiconductor device bring about an increase in power consumption. The amount of heat generated per unit area tends to increase accordingly. For this reason, a technology for improving heat dissipation characteristic of semiconductor devices is essential in order to ensure stable operation of semiconductor devices.

Typically, a semiconductor chip is mounted by flip-chip bonding using solder bumps, with the surface provided with chip electrodes facing down. In one known technology for facilitating heat dissipation from a flip-chip semiconductor device, heat generated in a semiconductor chip is dissipated by, for example, providing a heat spreader on the back surface of a semiconductor chip via a thermal interface material (hereinafter, referred to as TIM), as shown in FIG. 8 of patent document No. 1.

[patent document No. 1] JP 2001-257288

DISCLOSURE OF THE INVENTION

Problem to be Solved by the Invention

In the related art, non-uniformity in the thickness of a thermal interface material may occur in a flip-chip semiconductor device in which a heat spreader or the like is mounted on the back surface of a semiconductor chip via a TIM, with the result that the distance between the back surface of the semiconductor chip and the heat sink or the like cannot be maintained uniform. For this reason, the heat dissipation characteristic of the semiconductor chip may differ from one location to another. As a result, temperature may be non-uniform on the back surface of the semiconductor chip, impairing stable operation of the semiconductor chip.

In this background, a general purpose of the present invention is to provide a semiconductor device in which heat dissipation characteristic of a flip-chip mounted semiconductor chip is improved.

Means to Solve the Problem

One aspect of the present invention relates to a semiconductor device. The semiconductor device comprises: a substrate; a semiconductor chip mounted on the substrate face down; and a sealing resin layer operative to seal the semiconductor chip, wherein the back surface of the semiconductor chip is exposed through the sealing resin and is convex with respect to the upper surface of the sealing resin layer.

With this, the sealing resin melt in molding the sealing resin layer is prevented from reaching the back surface of the semiconductor chip, thereby maintaining the back surface of the semiconductor chip flat. Consequently, this ensures a uniform distance within the plane between the back surface of the semiconductor chip and a heat sink or a heat spreader, which is bonded to the back surface of the semiconductor chip via a thermal interface material. Accordingly, heat is uniformly transferred from the semiconductor chip to the heat sink or the like. Thereby, localized temperature increase in the back surface of the semiconductor chip is minimized and the stability of operation of the semiconductor chip 30 is improved accordingly.

A gutter may be formed in the sealing resin layer in the neighborhood of the semiconductor chip. Where a heat spreader or the like is bonded to the back surface of the semiconductor chip via a TIM, the provision of the gutter allows excess TIM exuding from the space between the back surface of the semiconductor chip and the heat spread or the like to be accumulated in the gutter, by exerting a certain pressure on the heat spread or the like. This prevents excess TIM from running into locations where it is unwanted.

A step difference may be provided in the upper surface of the sealing resin layer. The upper surface of the sealing resin layer in the neighborhood of the semiconductor chip may be higher than the upper surface of the sealing resin layer around.

Another aspect of the present invention relates to a method of manufacturing a semiconductor device. The method of manufacturing a semiconductor device comprises: flip-chip mounting a semiconductor chip face down on a substrate provided with a wiring pattern; and filling a space formed between an upper die and the substrate with a sealing resin while the upper die is pressed against a lower die carrying the substrate, the upper die being formed such that a chip contact surface, which comes into contact with the back surface of the semiconductor chip in molding a resin, is concave with respect to a resin molding surface located around the chip contact surface. The method of manufacturing a semiconductor device may comprise filling the clearance between the flip-chip mounted semiconductor chip and the substrate is filled with an underfill resin. The method of manufacturing a semiconductor device may comprise covering the upper die with a release film. An upper die, in which a gutter formation part is provided in the resin molding surface in the neighborhood of the chip contact surface, may be used in the filling step. As a result, a gutter is formed in the sealing resin layer in the neighborhood of the semiconductor chip.

Still another aspect of the present invention relates to a semiconductor device. The semiconductor device comprises: a substrate; a semiconductor chip mounted on the substrate face down; and a sealing resin layer operative to seal the semiconductor chip, wherein the back surface of the semiconductor chip is exposed through the sealing resin and a gutter with a bottom lower in level than the back surface of the semiconductor chip is provided in the sealing resin layer in the neighborhood of the semiconductor chip.

Where a heat sink, a heat spreader, or the like is bonded to the back surface of the semiconductor chip via a thermal interface material, the provision of the gutter allows excess thermal interface material to be accumulated in the gutter, by allowing excess thermal interface material to run into the gutter. As a result, the distance between the back surface of the semiconductor chip and the heat sink or the like is maintained uniform. Accordingly, heat is uniformly transferred from the semiconductor chip to the heat sink or the like. Thereby, localized temperature increase in the back surface of the semiconductor chip is minimized and the stability of operation of the semiconductor chip is improved accordingly. By accumulating excess TIM in the gutter, excess TIM is prevented from running into locations where it is unwanted.

The back surface of the semiconductor chip may be concave with respect to the upper surface of the sealing resin layer. The upper surface of the sealing resin layer and the back surface of the semiconductor chip may be of the same height.

A step difference may be provided on the upper surface of the sealing resin layer outside an area where the gutter is formed. The upper surface of the sealing resin layer in the neighborhood of the semiconductor chip may be higher than the upper surface of the sealing resin layer around. By providing a step difference commensurate with the warp of the semiconductor device occurring in the absence of a step difference, the distance between the back surface of the semiconductor chip and the heat sink or the like is less affected by the warp of the semiconductor device and is maintained uniform due to the reduction in the warp of the semiconductor device.

Still another aspect of the present invention relates to a semiconductor device. The method of manufacturing a semiconductor device comprises: flip-chip mounting a semiconductor chip face down on a substrate provided with a wiring pattern; and filling a space formed between an upper die and the substrate with a sealing resin while the upper die is pressed against a lower die carrying the substrate, the upper die being provided with a chip contact surface, which is adapted to come into contact with the back surface of the semiconductor chip, and with a resin molding surface located around the chip contact surface and adapted to mold a sealing resin layer, wherein an upper die, in which a gutter formation part is provided in the resin molding surface in the neighborhood of the chip contact surface, is used in the filling step. The method of manufacturing a semiconductor device may comprise filling the clearance between the flip-chip mounted semiconductor chip and the substrate is filled with an underfill resin. The method of manufacturing a semiconductor device may comprise covering the upper die with a release film.

An upper die, in which the chip contact surface is at a height between the height of the major surface of the resin molding surface outside the gutter formation part and the height of the upper surface of the gutter formation part, may be used in molding a sealing resin. An upper die, in which the chip contact surface is at a height equal to that of the major surface of the resin molding surface outside the gutter formation part, may be used in molding a sealing resin.

Still another aspect of the present invention relates to a method of manufacturing a semiconductor device. The method of manufacturing a semiconductor device comprises: flip-chip mounting a semiconductor chip face down on a substrate provided with a wiring pattern; and supplying a resin while an upper die is pressed against a lower die, the upper die being provided with a resin molding surface, and the lower die carrying a substrate and a movable die movable within a through hole in the upper die in a direction in which the upper die is opened or closed, wherein the movable die is provided with a chip contact surface adapted to come into contact with the back surface of the semiconductor chip, a gutter formation part provided outside the chip contact surface and in the neighborhood thereof for formation of a gutter, and a step difference formation part provided outside the gutter formation part and in the neighborhood thereof. The method of manufacturing a semiconductor device may comprise filling the clearance between the flip-chip mounted semiconductor chip and the substrate is filled with an underfill resin. The method of manufacturing a semiconductor device may comprise covering the upper die with a release film.

Optional combinations of the aforementioned elements may also be encompassed within the scope sought to be protected by the application.

ADVANTAGE OF THE PRESENT INVENTION

According to the present invention, heat dissipation characteristic of a semiconductor device in which a semiconductor chip is flip-chip mounted is improved.

DESCRIPTION OF THE REFERENCE NUMERALS

10 semiconductor device, 20 substrate, 30 semiconductor chip, 40 sealing resin layer, 50 solder ball

BEST MODE FOR CARRYING OUT THE INVENTION

A description will be given, with reference to the drawings, of the embodiments embodying the present invention.

First Embodiment

Figure 1A:
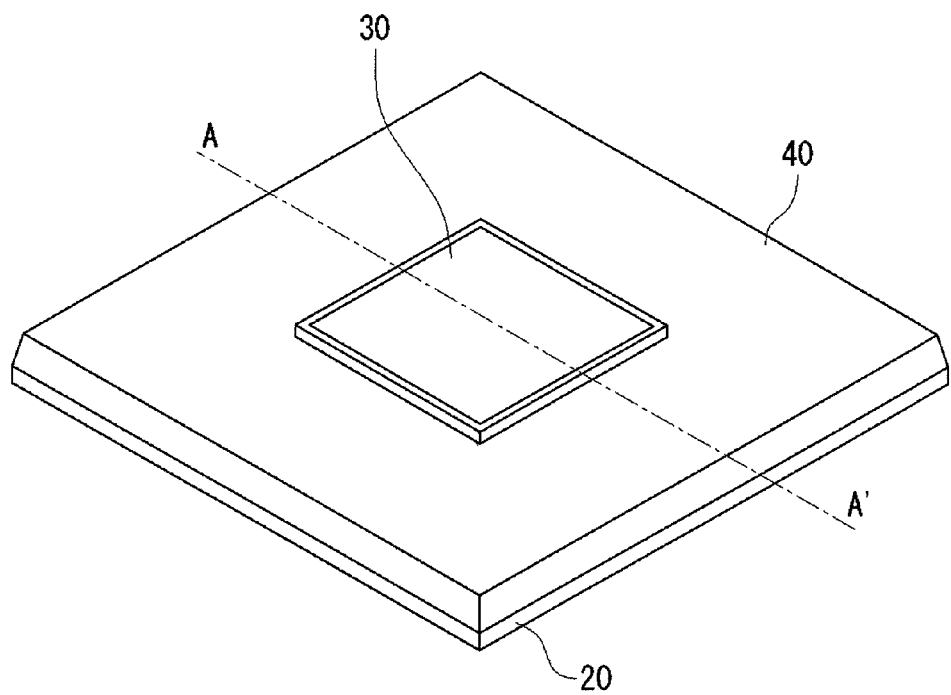
FIG. 1A is a perspective view showing the schematic structure of a semiconductor device according to a first embodiment.
Figure 1B:
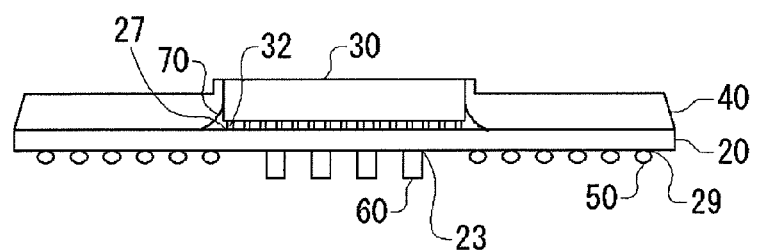
FIG. 1B is a sectional view along the line A-A' of FIG. 1A.

FIG. 1A is a perspective view showing the schematic structure of a semiconductor device 10 according to the first embodiment. FIG. 1B is a sectional view along the line A-A' of FIG. 1A. The semiconductor device 10 is provided with a substrate 20, a semiconductor chip 30 flip-chip mounted on the substrate 20 face down, and a sealing resin layer 40 sealing the perimeter of the semiconductor chip 30. The semiconductor device 10 according to this embodiment has a ball grid array (BGA) semiconductor packaging structure in which an array of a plurality of solder balls 50 are provided on the back surface of the substrate 20.

Figure 2:
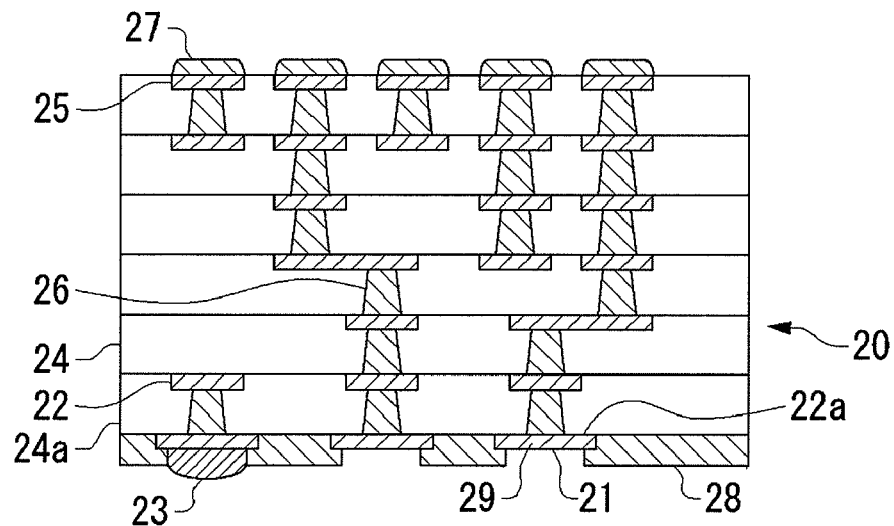
FIG. 2 is a sectional view showing the structure of a substrate according to the first embodiment in detail.

The substrate 20 according to this embodiment has a multilayer structure comprising interlayer insulating films and interconnects alternately. FIG. 2 is a sectional view showing the structure of the substrate 20 in detail. A stack comprising a plurality of interconnects 22 is built, supported by interlayer insulating films 24. For example, copper is used to form the interconnect 22. The interconnects 22 at different layers in the stack are electrically connected to each other via a via plug 26 provided in the interlayer insulating film 24. A solder resist film 28 formed of a heat resistant resin material is formed around the perimeter of an interconnect 22a on the back surface of the substrate 20. An interlayer insulating film 24a at the bottom layer is coated so that solder is deposited only on necessary locations. An array of ball lands 29 to which is bonded the solder ball 50 is provided on the back surface of the substrate 20. The surface of each of the ball lands 29 is coated with an organic solderability preservative coating (OSP) 21. An electrode pad 23 of tin (Sn), silver (Ag), copper (Cu), or an alloy thereof is formed in an electrode portion where a capacitor 60 is mounted. An array of a plurality of electrode pads 25 formed of electrolytically plated nickel (Ni), lead (Pd), gold (Au), or an alloy thereof is provided on the surface of the substrate 20 where the semiconductor chip is mounted. A controlled collapse chip connection (C4) bump 27 formed of tin, lead, or an alloy thereof is provided on each electrode pad 25.

By using a coreless substrate 20, the thickness of a six-layer structure can be reduced to about 300 μm, for example. By reducing the thickness of the substrate 20, interconnect resistance is reduced so that the operating speed of the semiconductor divide 10 is increased.

Referring back to FIGS. 1A and 1B, the solder ball 50 is bonded to each of the ball lands 29 provided on the back surface of the substrate 20. The capacitor 60 is mounted on the electrode pad 23 provided on the back surface of the substrate 20.

The semiconductor chip 30 such as an LSI is flip-chip mounted on the surface of the substrate 20 face down. More specifically, a solder bump 32, which serves as an electrode for external connection for the semiconductor chip 30, and the C4 bump 27 of the substrate 20 are soldered. The clearance between the semiconductor chip 30 and the substrate 20 is filled with an underfill 70. By providing the underfill 70 between the semiconductor chip 30 and the wiring substrate 20, the stress, induced in the C4 bumps 27 due to a variation in the gap between the wiring substrate 20 and the semiconductor chip 30 occurring as a result of thermal expansion in a temperature cycle, is minimized.

The sealing resin layer 40, which seals the semiconductor chip 30, is formed around the semiconductor chip 30. In this embodiment, the back surface of the semiconductor chip 30 is exposed and is convex with respect to the upper surface of the sealing resin layer 40. In this embodiment, the sides of the semiconductor chip 30 are completely sealed by the sealing resin layer 40. The height of the upper surface of the sealing resin layer 40 adjacent to the semiconductor chip 30 is the same as the height of the back surface of the semiconductor chip 30. With this, the sides of the semiconductor chip 30 are more properly sealed so that the semiconductor chip 30 is more properly protected. However, if the upper end of the sides of the semiconductor chip 30 need not be sealed by the sealing resin layer 40, the upper end of the sides of the semiconductor chip 30 may be exposed.

With this, the sealing resin melt in molding the sealing resin layer 40 is prevented from reaching the back surface of the semiconductor chip 30, thereby maintaining the back surface of the semiconductor chip 30 flat. Consequently, this ensures a uniform distance within the plane between the back surface of the semiconductor chip 30 and a heat sink or a heat spreader, which is bonded to the back surface of the semiconductor chip 30 via a TIM. Accordingly, heat is uniformly transferred from the semiconductor chip 30 to the heat sink or the like. Thereby, localized temperature increase in the back surface of the semiconductor chip 30 is minimized and the stability of operation of the semiconductor chip 30 is improved accordingly.

Preferably, the sealing resin layer 40 covers the substrate 20 outside the outermost solder ball 50 in the array of a plurality of solder balls 50. This ensures that the strength of the substrate 20 is increased in the presence of the sealing resin layer 40 so that the warp of the substrate 20 is minimized. Thus, the sealing resin layer 40 also functions as a reinforcer for the substrate 20. The strength of the semiconductor device 10 as a whole is maintained even if the thickness of the substrate 20 is reduced further.

The capacitor 60 is connected to locations in the back surface of the substrate 20 immediately below the semiconductor chip 30. With this, the wiring route between the semiconductor chip 30 and the capacitor 60 is reduced so that the wiring resistance is reduced. The capacitor 60 may not be provided at locations in the back surface of substrate immediately below the semiconductor 30. For example, the capacitor 60 may be provided at locations in the back surface of the substrate 20 which are not immediately below the semiconductor chip 30 so long as it is ensured that the wiring route is sufficiently short. The capacitor 60 may provided on the surface of the substrate 20 and the sealing resin layer 40 may seal the capacitor 60 so long as it is ensured that the wiring route is sufficiently short.

(Method of Manufacturing Semiconductor Device)

Figure 3:
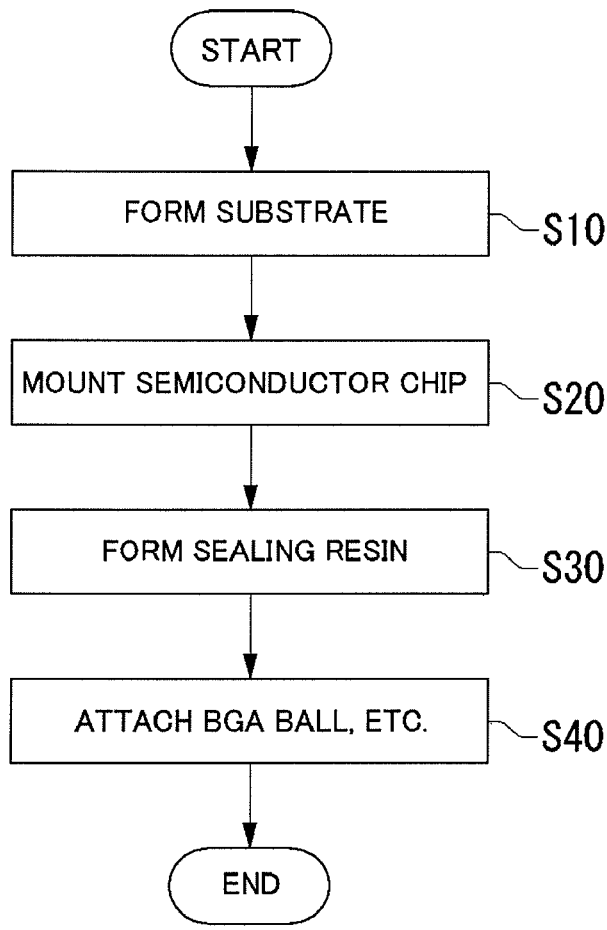
FIG. 3 schematically shows the flow of a method of manufacturing the semiconductor device according to the first embodiment.

FIG. 3 schematically shows the flow of a method of manufacturing the semiconductor device according to the first embodiment. A substrate having a multilayer structure is formed (S10), and a semiconductor chip is mounted on the substrate (S20). Subsequently, the semiconductor chip is sealed by a sealing resin (S30). Finally, solder balls, capacitors, and the like are attached to the back surface of the substrate (S40).

A detailed description will be given below of the method of forming a substrate, the method of mounting a semiconductor chip, and the method of forming a sealing resin.

(1. Method of Forming Substrate).

FIGS. 4A-8B are sectional views showing the steps of forming the substrate 20 of the semiconductor device 10 according to the first embodiment.

Figure 4A:
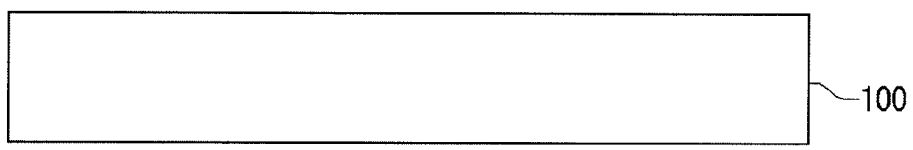
FIGS. 4A-4C are sectional views showing the steps of forming the substrate of the semiconductor device according to the first embodiment.
Figure 4B:
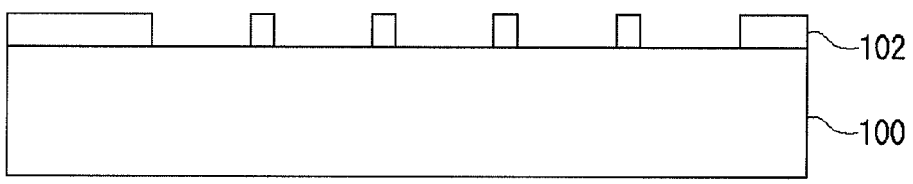

First, as shown in FIGS. 4A and 4B, a copper substrate 100 is coated with a resist film 102 and patterned by laser irradiation to have openings.

Figure 4C:
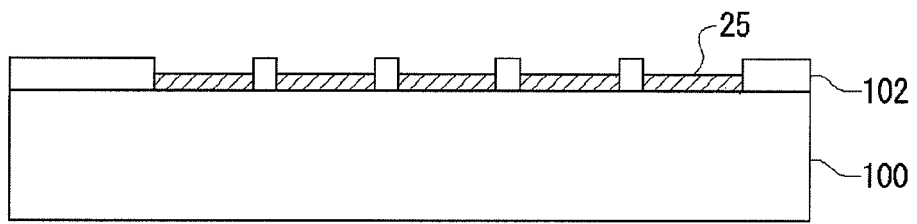

Then, as shown in FIG. 4C, the electrode pads 25 formed of nickel (Ni), lead (Pd), gold (Au), or an alloy thereof are formed on the copper substrate 100 by electrolytic plating, using the resist film 102 as a mask.

Figure 5A:
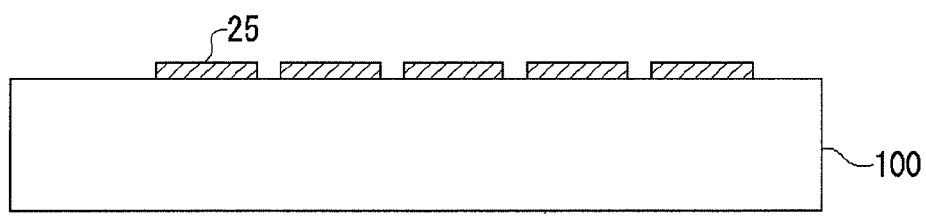
FIGS. 5A-5C are sectional views showing the steps of forming the substrate of the semiconductor device according to the first embodiment.
Figure 5B:
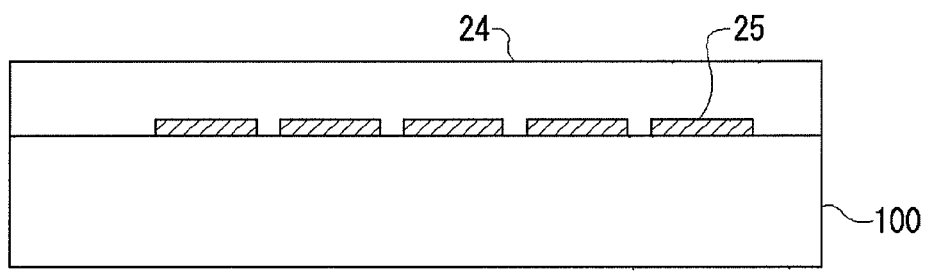

Then, as shown in FIG. 5A, the resist film 102 is removed and then, as shown in FIG. 5B, the interlayer insulating film 24 is formed on the copper substrate 100.

Figure 5C:
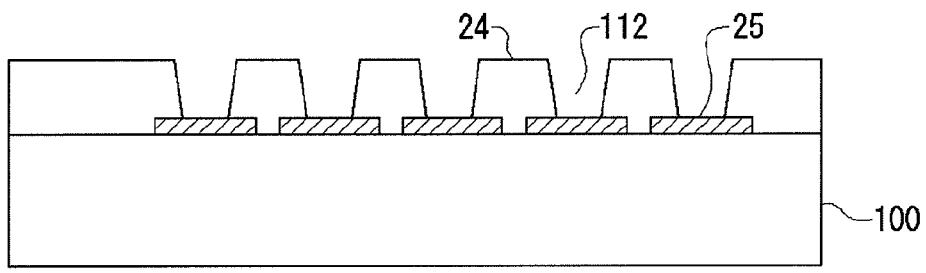

Then, as shown in FIG. 5C, certain regions of the interlayer insulating film 24 are removed by a laser beam so as to form via holes 112. Since the via holes 112 of the semiconductor device 10 according to this embodiment are formed by laser machining, the manufacturing cost is lower than when the holes are made by drilling.

Figure 6A:
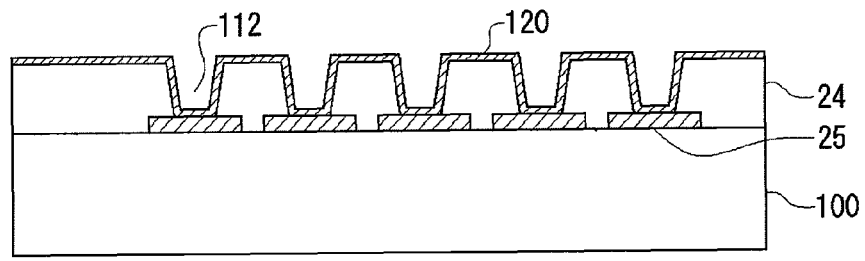
FIGS. 6A-6D are sectional views showing the steps of forming the substrate of the semiconductor device according to the first embodiment.

Then, as shown in FIG. 6A, non-electrolytic plating is performed to form a copper seed layer 120 on the surface of the interlayer insulating films 24 so as to cover the side wall and the bottom of the via holes 112. The seed layer 120 represents a copper core which grows in the electrolytic copper plating described later.

Figure 6B:
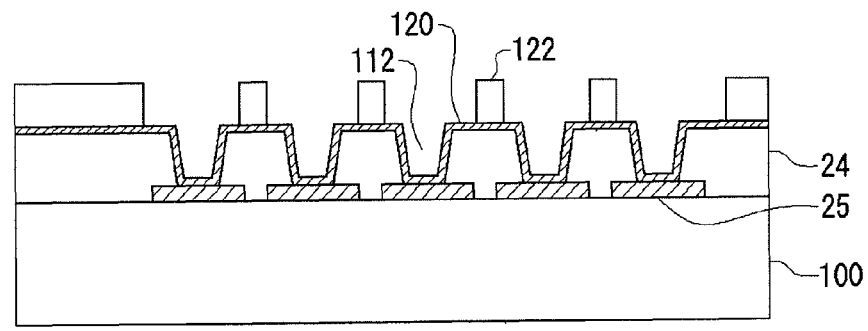

Then, as shown in FIG. 6B, the seed layer 120 is coated with a resist film 122 and patterned by laser irradiation to have openings.

Figure 6C:
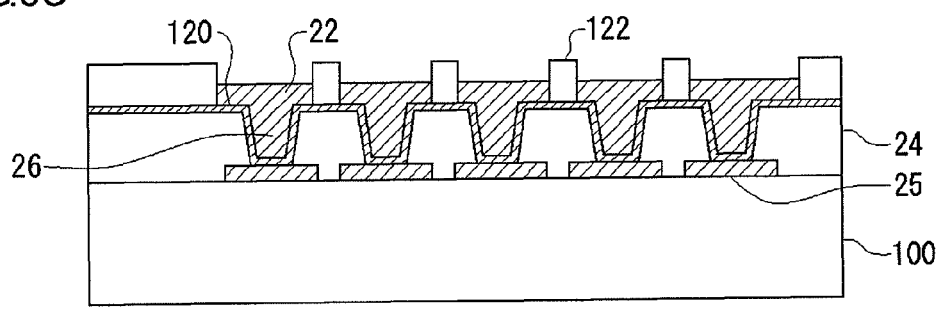

Then, as shown in FIG. 6C, copper is embedded in the via holes 112 by electrolytic plating, using the resist film 122 as a mask, so as to form the via plugs 26 and form the interconnects 22 on the interlayer insulating film 24. The via plugs 26 electrically connect the interconnects 22 at different layers.

Figure 6D:
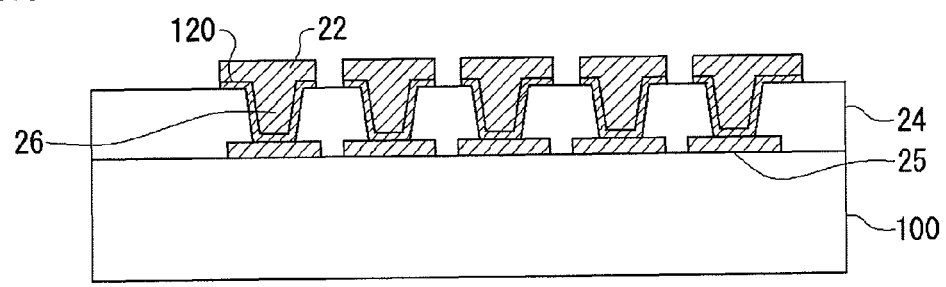

Then, as shown in FIG. 6D, the resist film 122 is removed and the seed layer 120 located underneath the resist film 122 is removed by etching. The surface of the interconnects 22 is cleaned by removing the outermost surface of the interconnects 22.

Figure 7A:
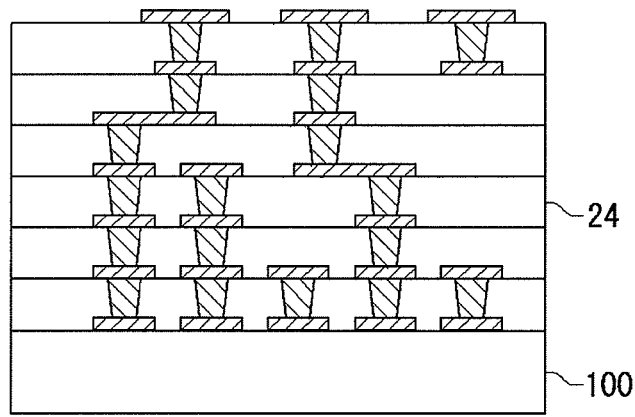
FIGS. 7A-7C are sectional views showing the steps of forming the substrate of the semiconductor device according to the first embodiment.

By repeating the steps shown in FIGS. 4A-6B, the multilayer structure as shown in FIG. 7A is built.

Figure 7B:
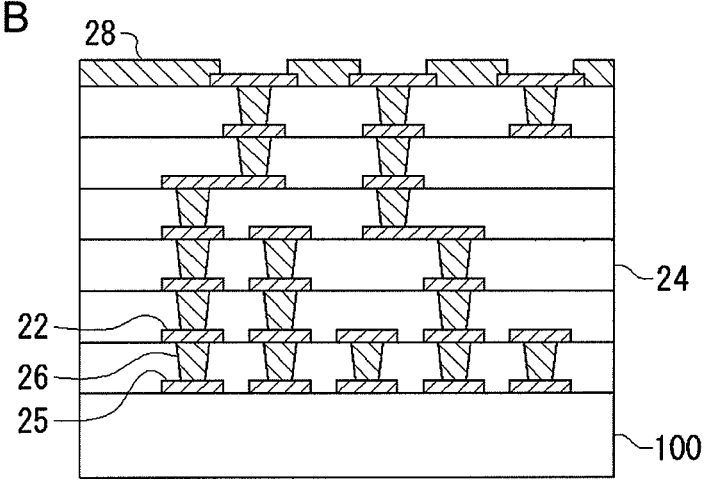

Then, as shown in FIG. 7B, the solder resist film 28 is formed on the interlayer insulating film 24, using a resist film (not shown) as a mask, so that the interconnect layer 22 in the top layer is exposed.

Figure 7C:
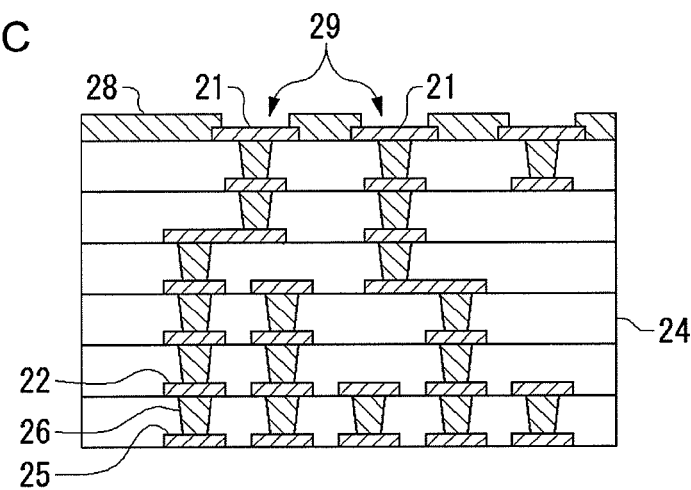

Then, as shown in FIG. 7C, the copper substrate 100 is removed. The surface of the ball lands 29 bonded to BGA balls is coated with the organic solderability preservative coating (OSP) 21.

Figure 8A:
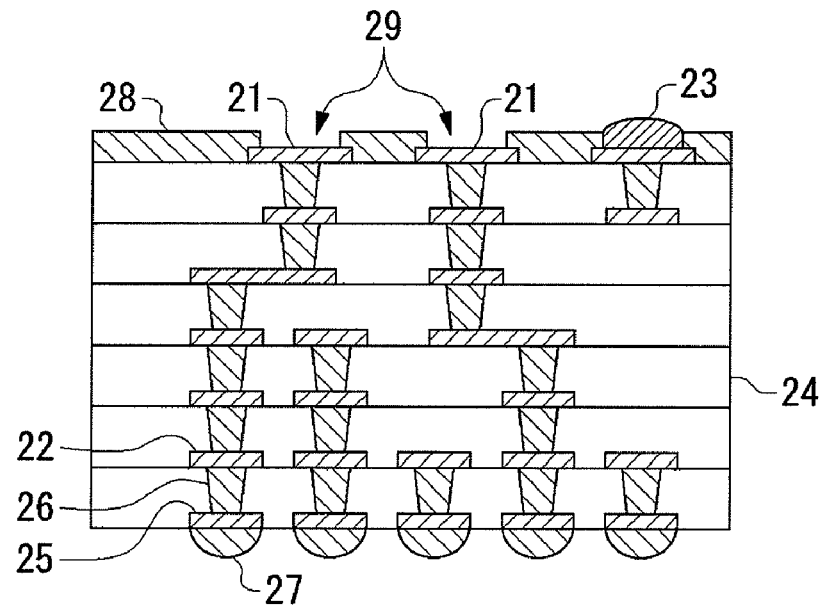
FIGS. 8A-8B are sectional views showing the steps of forming the substrate of the semiconductor device according to the first embodiment.

Then, as shown in FIG. 8A, the C4 bumps 27 for flip-chip mounting are soldered to the electrode pads 25. The electrode pad 23 of tin (Sn), silver (Ag), copper (Cu), or an alloy thereof is soldered to an electrode portion where a capacitor is mounted.

Figure 8B:
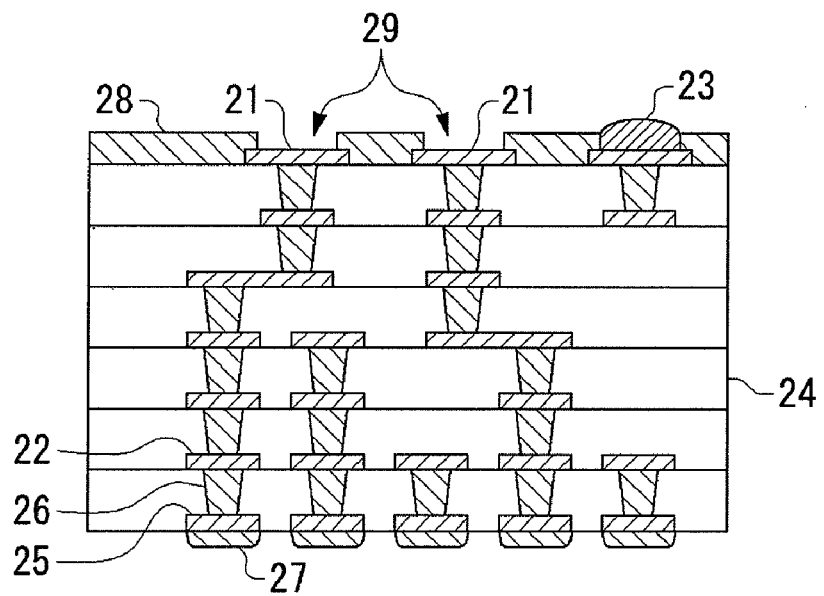

Then, as shown in FIG. 8B, the C4 bumps 27 are flattened by pressing.

Through the steps described above, the substrate 20 used in this embodiment is formed. FIG. 8B shows the substrate 20 shown in FIG. 2 upside down.

According to the inventive method, the thickness of the substrate including six layers of interlayer insulating films can be reduced to about 300 µm. Since the via holes are formed by laser machining, the manufacturing cost is reduced.

(2. Method of Mounting Semiconductor Chip)

Figure 9A:
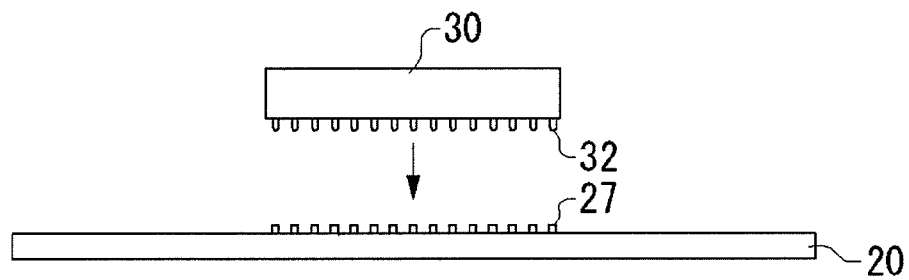
FIGS. 9A-9B are sectional views showing the steps of mounting a semiconductor chip of the semiconductor device according to the first embodiment.
Figure 9B:
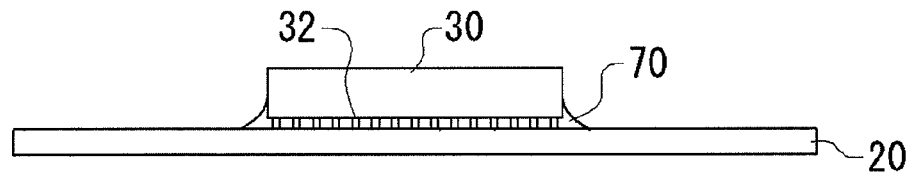

FIGS. 9A-9B are sectional views showing the steps of mounting the semiconductor chip 30 of the semiconductor device 10 according to the first embodiment.

As shown in FIG. 9A, the semiconductor chip 30 is mounted by flip-chip bonding by soldering the solder bumps 32 and the corresponding C4 bumps 27, with the surface of the semiconductor chip 30 provided with the chip electrodes facing down.

Then, as shown in FIG. 9B, the clearance between the semiconductor chip 30 and the substrate 20 is filled with an underfill 70.

Through these steps, the semiconductor chip 30 is flip-chip mounted on the substrate 20 such that the stress created where solder bonding occurs is distributed by the under fill 70.

(3. Method of Forming Sealing Resin)

FIGS. 10A-11B show the steps of forming the sealing resin layer 40 of the semiconductor device 10 according to the first embodiment.

A description will now be given of the structure of an upper die 200a and a lower die 210 used in the method of forming the resin. The upper die 200a is provided with a runner 202 through which molten sealing resin runs. The runner 202 is provided with openings which open to a cavity 220 formed when the upper die 200a and the lower die 210 are matched. The molding surface of the upper die 200a includes a chip contact surface 207 which comes into contact with the back surface of the semiconductor chip 30 in the resin molding step, and a resin molding surface 206 located around the chip contact surface 207 and adapted to mold the sealing resin layer 40. In this embodiment, the chip contact surface 207 is concave with respect to the resin molding surface 206. By allowing the chip contact surface 207 to come into contact with the back surface of the semiconductor chip 30 in the resin molding step, the sealing resin is prevented from reaching the chip 30 in the resin molding step. The upper die 200a is also provided with a suction hole 204 communicating with a suction mechanism such as a pump. The convexity or concavity in the upper die is defined with reference to the molding surface facing upward.

The lower die 210 is provided with a pot 214 in which a reciprocally movable plunger 212 is formed.

Figure 10A:
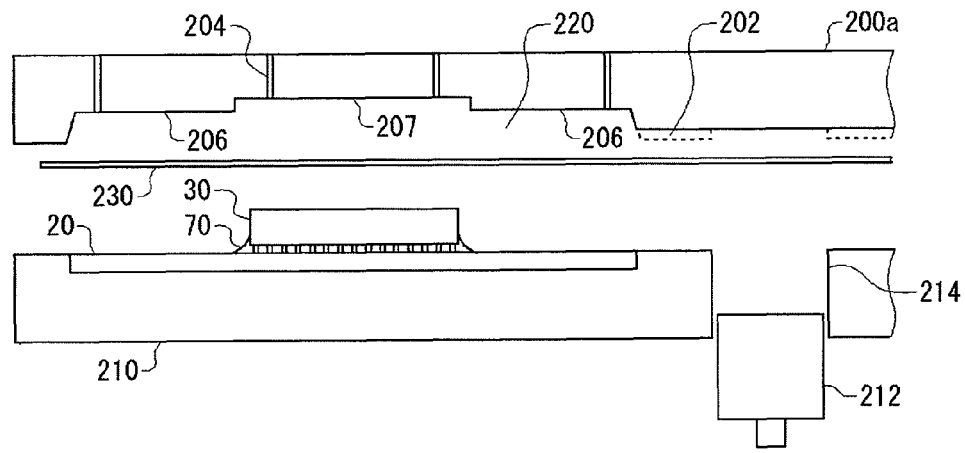
FIGS. 10A-10C show the steps of forming a sealing resin layer of the semiconductor device according to the first embodiment.

As shown in FIG. 10A, the upper die 200a and the lower die 210 are used to place the substrate 20 carrying the semiconductor chip 30 on the lower die 210. A release film 230 is placed between the upper die 200a and the lower die 210.

Figure 10B:
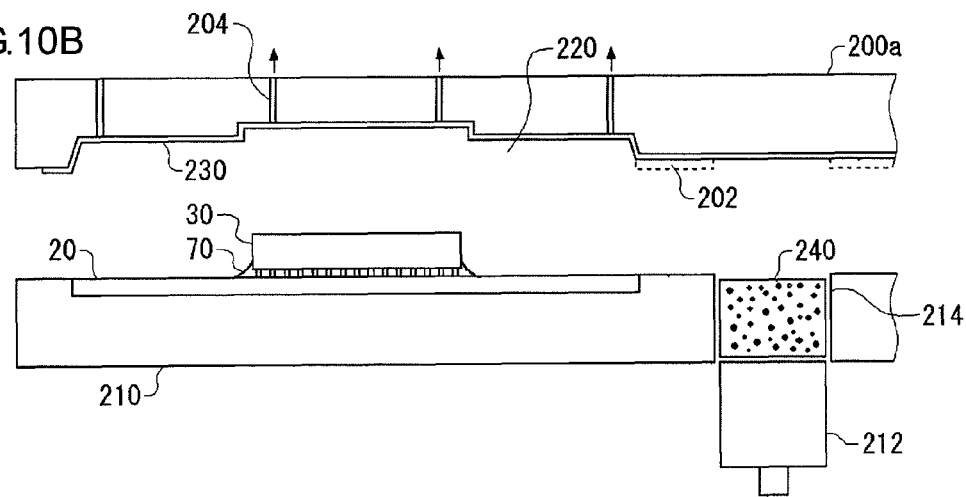

Then, as shown in FIG. 10B, a resin tablet (solidified sealing resin) 240 is introduced into the pot 214. By activating the suction mechanism, the space between the release film 230 and the upper die 200a is evacuated so as to attach the release film 230 to the upper die 200a intimately.

Figure 10C:
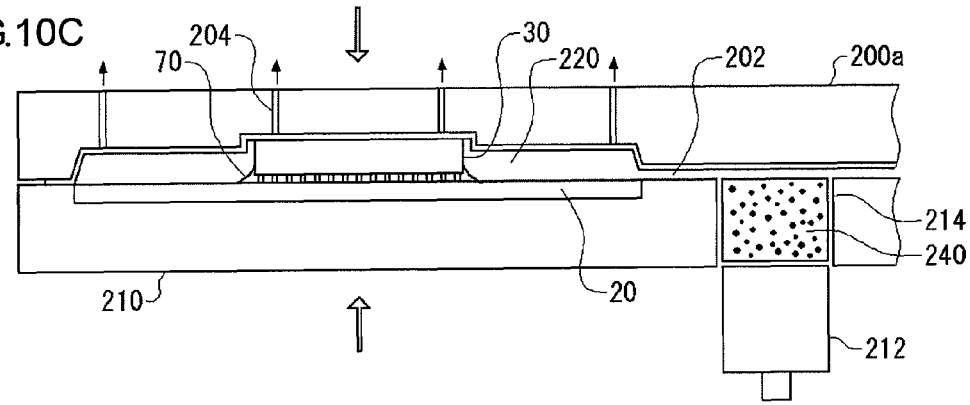

Then, as shown in FIG. 10C, a die-matched assembly of the upper die 200a and the lower die 210 is clamped.

Figure 11A:
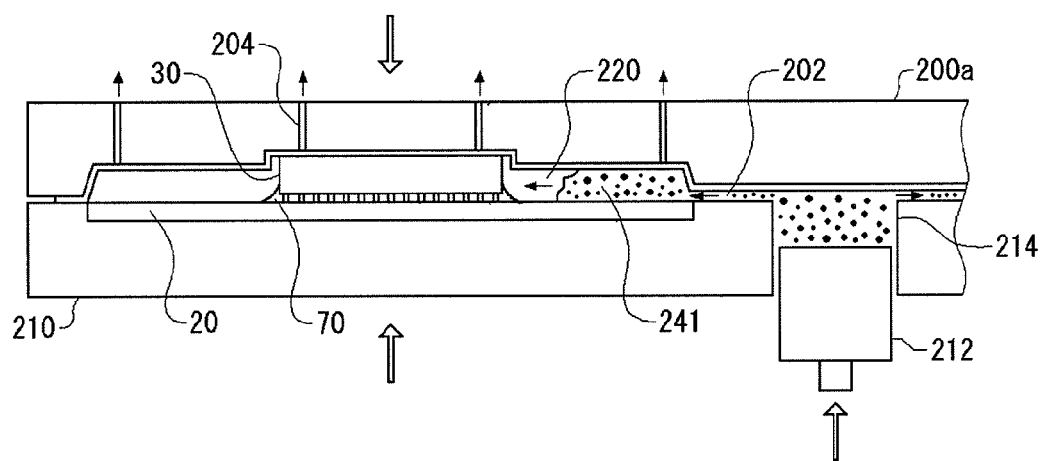
FIGS. 11A-11B show the steps of forming sealing resin layer of the semiconductor device according to the first embodiment.

Then, as shown in FIG. 11A, the plunger 212 is thrust into the pot 214 while the resin tablet 240 is heated and is in a molten state. In this way, the liquefied sealing resin 241 is introduced into the cavity 220. The space formed between the upper die 200a and the substrate 20 is filled with the sealing resin 241, and then a heating process is performed for a predetermined period of time.

Figure 11B:
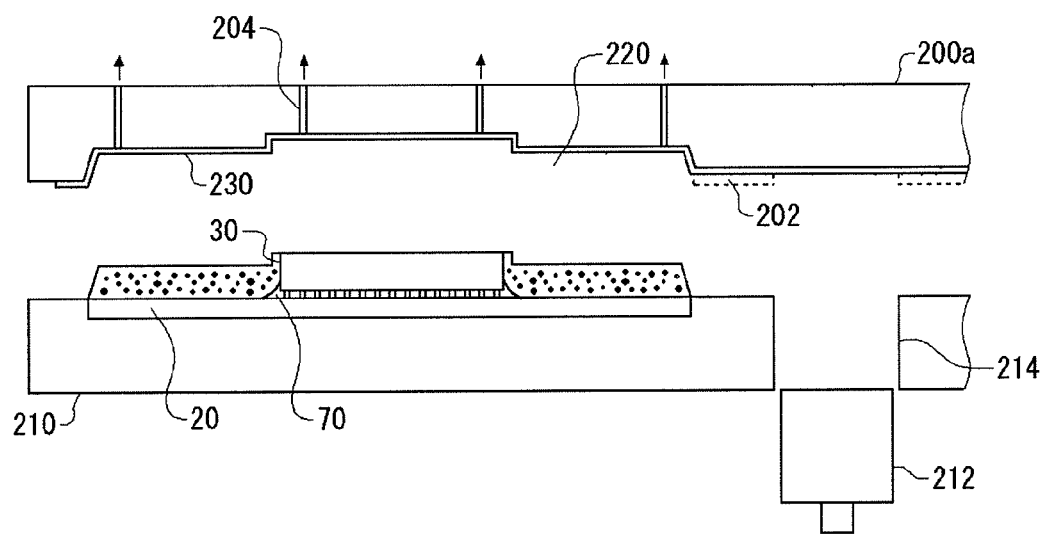

Then, as shown in FIG. 11B, the upper die 200a and the lower die 210 are separated from each other, and the substrate 20, in which the sealing resin layer 40 is formed, is taken out.

According to the method of forming a sealing resin described above, the sealing resin layer 40 for sealing the semiconductor chip 30 is formed around the chip 30. The back surface of the chip 30 is exposed and is convex with respect to the upper surface of the sealing resin layer 40.

Moreover, By using the release film 230, the sealing resin layer 40 is molded without causing the sealing resin 241 to be in contact with the interior surface of the cavity 220. This eliminates the need to clean the upper die 200a, the productivity is improved, and the manufacturing cost is reduced.

Second Embodiment

Figure 12A:
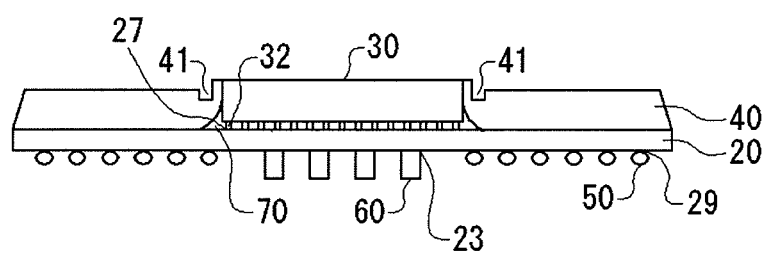
FIG. 12A is a sectional view showing the structure of a semiconductor device according to a second embodiment.

FIG. 12A is a sectional view showing the structure of a semiconductor device 10a according to a second embodiment. Those components that are the same as or similar to the components of the semiconductor device 10 according to the first embodiment will be omitted in describing the semiconductor device 10a according to the second embodiment. The description will concern the differences from the semiconductor device 10 according to the first embodiment. In the semiconductor device 10a according to this embodiment, a gutter 41 is formed in the sealing resin layer 40 in the neighborhood of the semiconductor chip 30. Where a heat spreader or the like is bonded to the back surface of the semiconductor chip 30 via a TIM, the provision of the gutter allows excess TIM exuding from the space between the back surface of the semiconductor chip 30 and the heat spread or the like to be accumulated in the gutter 41, by exerting a certain pressure on the heat spread or the like. This prevents excess TIM from running into locations where it is unwanted. The gutter 41 may not be contiguous around the semiconductor chip 30. For example, four gutters 41 may be provided along the sides of the semiconductor chip 30.

The method of manufacturing the semiconductor device 10a according to the second embodiment is similar to that of the first embodiment. In manufacturing the semiconductor device 10a according to the second embodiment, however, an upper die 200b having a different shape from that of the first embodiment (FIGS. 10A-11B) is used in forming a sealing resin.

Figure 12B:
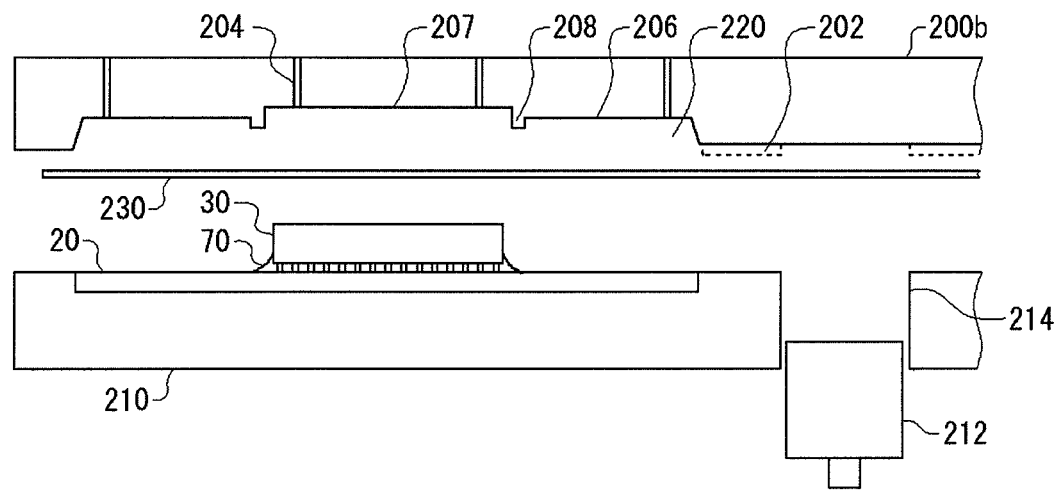

FIG. 12B shows the shape of the upper die 200b and the lower die 210 used in forming a sealing resin of the semiconductor device 10a according to the second embodiment. In the upper die 200b used in molding a resin of the semiconductor device 10a according to the second embodiment, a gutter formation part 208 is provided in the resin molding surface 206 in the neighborhood of the chip contact surface 207. The gutter formation part 208 forms the gutter 41 in the sealing resin layer 40 in the neighborhood of the semiconductor chip 30.

Third Embodiment

Figure 13A:
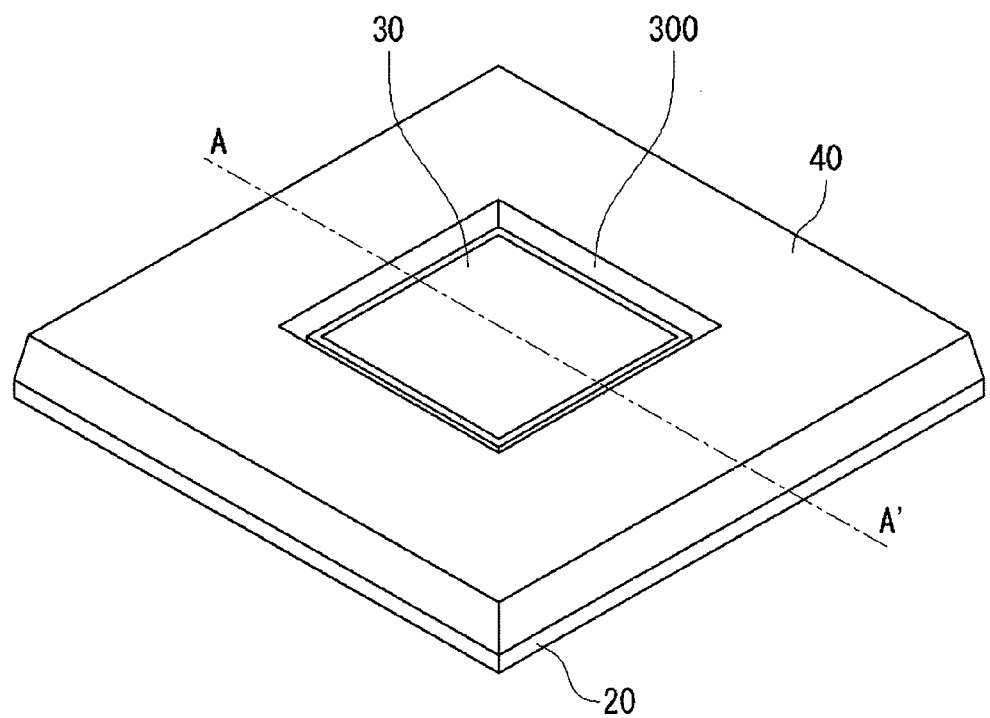
FIG. 13A is a perspective view showing the schematic structure of a semiconductor device according to a third embodiment.
Figure 13B:
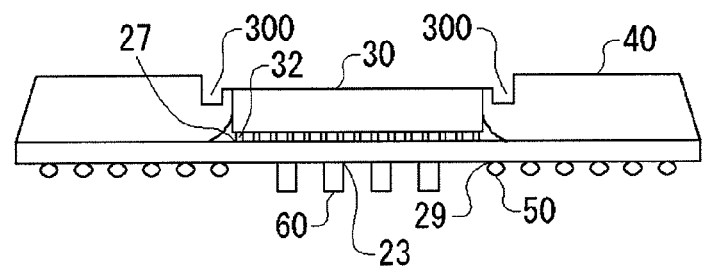
FIG. 13B is a sectional view along the line A-A' of FIG. 12A.

FIG. 13A is a perspective view showing the schematic structure of a semiconductor device 11 according to a third embodiment. FIG. 13B is a sectional view along the line A-A' of FIG. 13A. Those components that are the same as or similar to the components of the semiconductor device 10 according to the first embodiment will be omitted in describing the semiconductor device 11 according to the third embodiment. The description will concern the differences from the semiconductor device 10 according to the first embodiment.

In the semiconductor device 11, the back surface of the semiconductor chip 30, which is flip-chip mounted on the substrate 20, is concave with respect to the upper surface of the sealing resin layer 40. Further, a gutter 300 lower in level than the back surface of the semiconductor chip 30 is provided in the sealing resin layer 40 around the chip 30.

Where a heat sink or a heat spreader is bonded to the back surface of the semiconductor chip 30 via a TIM, the provision of the gutter allows excess TIM to be accumulated in the gutter 300, by allowing excess TIM to run into the gutter 300. As a result, the distance between the back surface of the semiconductor chip 30 and the heat sink or the like is maintained uniform. Accordingly, heat is uniformly transferred from the semiconductor chip 30 to the heat sink or the like. Thereby, localized temperature increase in the back surface of the semiconductor chip 30 is minimized and the stability of operation of the semiconductor chip 30 is improved accordingly. By accumulating excess TIM in the gutter, excess TIM is prevented from running into locations where it is unwanted.

The method of manufacturing the semiconductor device 11 according to the third embodiment is similar to that of the first embodiment. In manufacturing the semiconductor device 11 according to the third embodiment, however, an upper die 200 having a different shape from that of the first embodiment (FIGS. 10A-11B) is used in forming a sealing resin.

Figure 14:
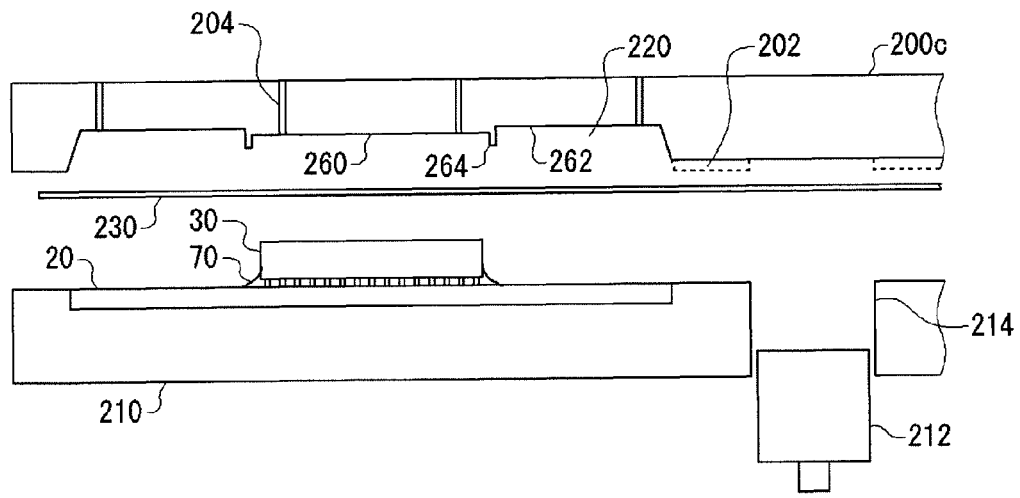
FIG. 14 shows the shape of an upper die and a lower die used in molding a sealing resin of the semiconductor device according to the third embodiment.

FIG. 14 shows the shape of the upper die 200c and the lower die 210 used in molding a sealing resin of the semiconductor device 11 according to the third embodiment. The molding surface of the upper die 200c according to this embodiment includes a chip contact surface 260 which comes into contact with the back surface of the semiconductor chip 30 in the resin molding step, and a resin molding surface 261 located around the chip contact surface 260 and adapted to mold the sealing resin layer 40. In the upper die 200c used in molding a resin of the semiconductor device 11 according to the third embodiment, a gutter formation part 264 is provided in the resin molding surface 261 in the neighborhood of the chip contact surface 260. The gutter formation part 264 forms the gutter 300 in the sealing resin layer 40 in the neighborhood of the semiconductor chip 30. The chip contact surface 260 of the upper die 200c is located at a level between a major surface 262 of the resin molding surface 261 outside the gutter formation part 264 and the upper surface of the gutter formation part 264.

By using the upper die 200c, the sealing resin layer 40 of the semiconductor device 11 shown in FIG. 13B is molded.

Fourth Embodiment

Figure 15:
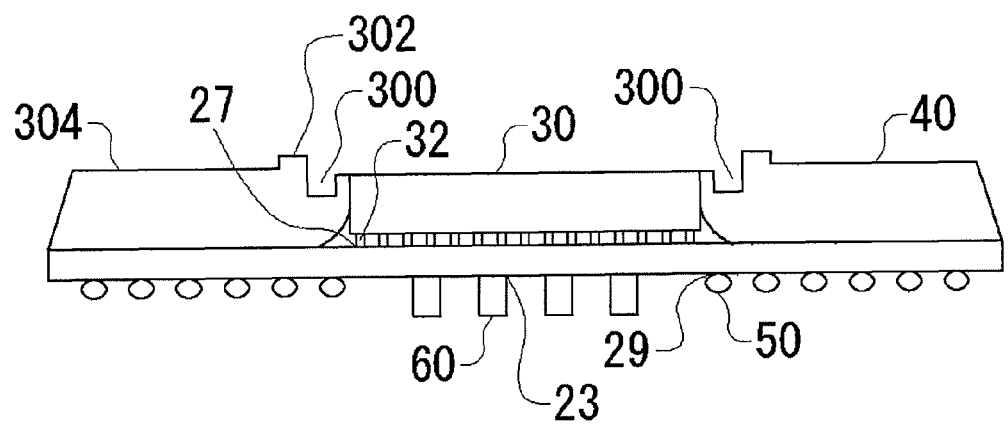
FIG. 15 is a sectional view showing the cross section of a semiconductor device according to a fourth embodiment.

FIG. 15 is a sectional view showing the cross section of a semiconductor device according to a fourth embodiment. Those components that are the same as or similar to the components of the semiconductor device 11 according to the third embodiment will be omitted in describing a semiconductor device 12 according to the fourth embodiment. The description will concern the differences from the semiconductor device 11 according to the third embodiment.

A step difference is provided on the upper surface of the sealing resin layer 40 of the semiconductor device 12. An upper surface 302 of the sealing resin layer 40 in the neighborhood of the semiconductor chip 30 is higher than an upper surface 304 of the sealing resin layer around. The height of the step difference, and the ratio between the extent of the upper surface 302 and that of the upper surface 304 are optimized in accordance with the warp of the semiconductor device 12 occurring in the absence of a step difference. By providing a step difference commensurate with the warp of the semiconductor device 12 occurring in the absence of a step difference, the distance between the back surface of the semiconductor chip and the heat sink or the like is less affected by the warp of the semiconductor device and is maintained uniform because it is less affected by the reduction in the warp of the semiconductor device.

For example, the step difference necessary to prevent warp may be designed by performing a simulation to predict the warp of the semiconductor device occurring when a step difference is not provided in the sealing resin layer 40, using the properties (coefficient of linear expansion, Young's modulus, etc.) of the substrate 20, the sealing resin layer 40, and the like as parameters.

Alternatively, a prototype semiconductor device, in which a step difference is not provided in the sealing resin layer 40, may be fabricated so that the difference necessary to prevent warp may be designed by actually measuring the warp of the semiconductor device.

The method of manufacturing the semiconductor device 12 according to the fourth embodiment is similar to that of the this embodiment. In manufacturing the semiconductor device 12 according to the fourth embodiment, however, an upper die 200d having a different shape from that of FIG. 14 is used.

Figure 16A:
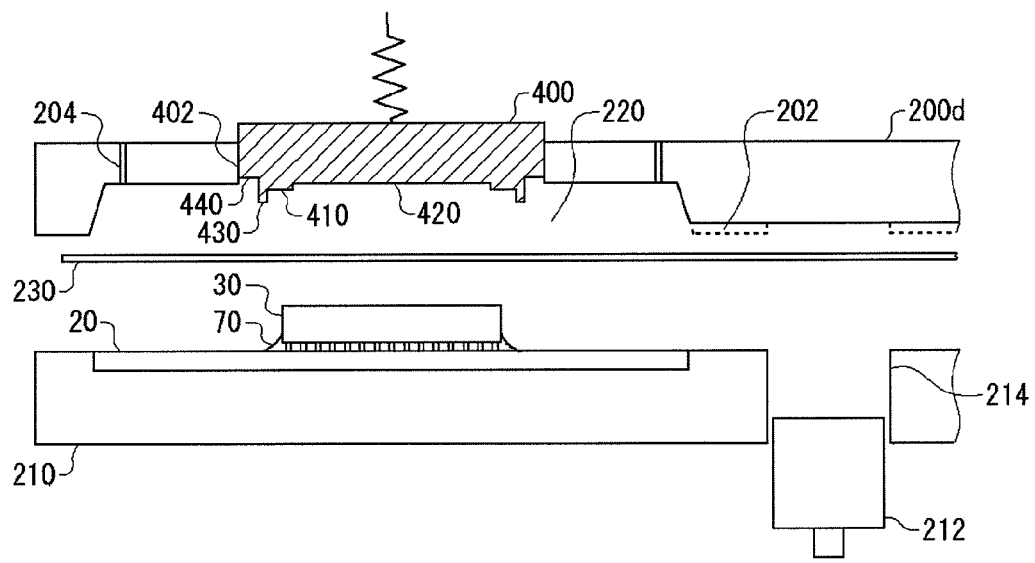
FIGS. 16A and 16B show an upper die and a lower die used in molding a sealing resin of the semiconductor device according to the fourth embodiment.
Figure 16B:
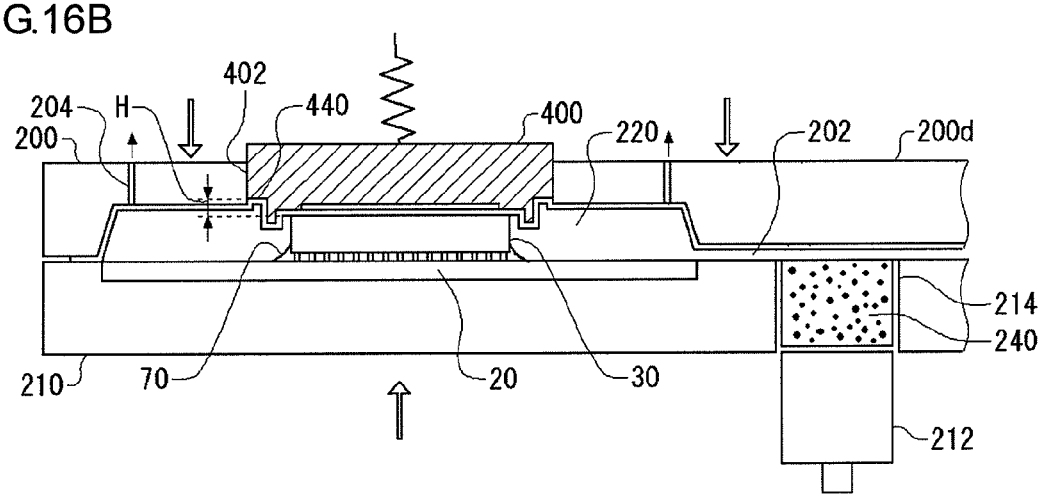

FIGS. 16A and 16B show the upper die 200d and the lower die 210 used in molding a sealing resin of the semiconductor device 12 according to the fourth embodiment.

As shown in FIG. 16A, the upper die 200d according to this embodiment is provided with a through hole 402 for letting in and out a movable die 400. The movable die 400 is movable in the direction in which the die is opened or closed and is provided with a chip contact surface 410 which comes into contact with the back surface of the semiconductor chip 30. The movable die 400 is adapted to press the semiconductor chip 30 toward the lower die 210 with a certain pressure while the chip contact surface 410 is in contact with the back surface of the semiconductor chip 30. To be more specific, the chip contact surface 410 of the movable die 400 comes into contact with the back surface of the perimeter of the semiconductor chip 30. The area surrounded by the chip contact surface 410 is concave with respect to the chip contact surface 410 and represents a chip non-contact surface 420 which does not come into contact with the back surface of the semiconductor chip 30. By providing a space between the chip non-contact surface 420 and the semiconductor chip 30, it is ensured that the chip contact surface 410 comes into contact with the back surface of the semiconductor chip 30 without being affected by the warp of the chip 30. A gutter formation part 30 for formation of a gutter is provided outside the chip contact surface 410 and in the neighborhood thereof. A step difference formation part 440 is provided outside the gutter formation part 430 and in the neighborhood thereof. The step difference formation part 440 is designed such that it is lower than the chip contact surface 410, and the thickness of sealing resin layer 40 molded by the step difference formation part 440 of the upper die 200d while the upper die 200d and the lower die 210 are matched is larger than the thickness of the sealing resin layer 40 molded by the resin molding surface 450.

By using the upper die 200d and the movable die 400, matching the upper die 200d and the lower die 210 as shown in FIG. 16B, and thrusting the movable die 400 against the back surface of the semiconductor chip 30, the distance H between the back surface of the semiconductor chip 30 and the step difference formation part 440 is defined by the shape of the movable die 400 and maintained uniform. By changing the shape of the movable die 400 in accordance with the warp of the substrate 20, a step difference of a desired height is provided on the upper surface of the sealing resin layer 40. Since the provision enables forming a step difference of a desired height on the upper surface of the sealing resin layer 40 without changing the design of the upper die 200d and only by changing the shape of the movable die 400, the cost of manufacturing the semiconductor device 12 is minimized.

The embodiments described are intended to be illustrative only and it will be obvious to those skilled in the art that various modifications such as design variations could be developed based upon the knowledge of a skilled person and that such modifications are also within the scope of the present invention.

In the embodiments, the substrate 20 is assumed to have a coreless multilayer structure. Alternatively, the inventive approach is applicable to a multilayer substrate having a core.

The method of forming a sealing resin described in the fourth embodiment is applicable to the first through third embodiments.

Figure 17A:
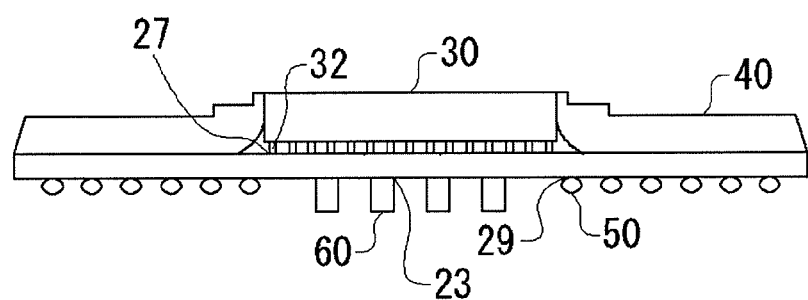
FIG. 17A is a sectional view showing a variation of the semiconductor device according to the first embodiment.
Figure 17B:
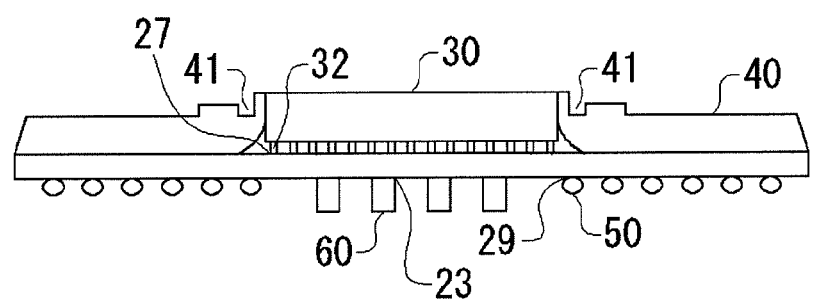
FIG. 17B is a sectional view showing a variation of the semiconductor device according to the second embodiment.

Further, as in the variations shown in FIGS. 17A and 17B, a step difference may be provided on the upper surface of the sealing resin layer 40 of the semiconductor device 10 of the first embodiment or of the semiconductor device 10a of the second embodiment so that an upper surface 500 of the sealing resin layer 40 in the neighborhood of the semiconductor chip 30 is higher than the upper surface 304 of the sealing resin layer around.

Figure 18A:
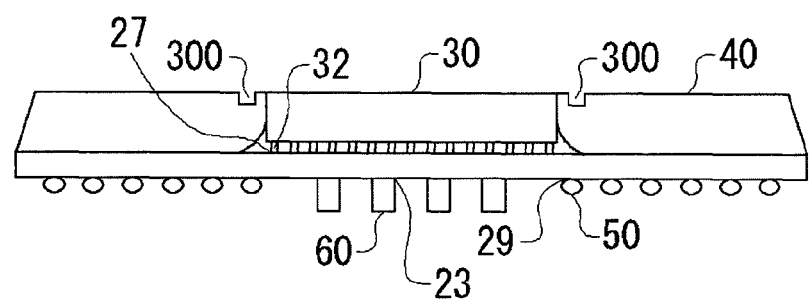
FIG. 18B is a sectional view showing a variation of the semiconductor device according to the second embodiment.
Figure 18B:
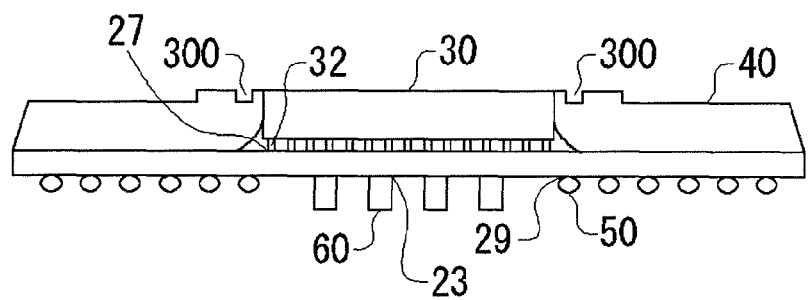

While the back surface of the semiconductor chip is concave with respect to the upper surface of the sealing resin layer around, the surface may be otherwise. As in the variations shown in FIGS. 18A and 18B, even if the back surface of the semiconductor chip and the upper surface of the surrounding sealing resin layer are of the same height, the distance between the back surface of the semiconductor chip and the heat sink or the like can be maintained uniform by accumulating excess TIM in the gutter when the heat sink or the like is bonded to the chip.

While a BGA semiconductor package is employed in the embodiments, a pin grid array (PGA) semiconductor package provided with pin leads or a land grid array (LGA) semiconductor package in which an array of electrodes is provided may also be employed.

The method of manufacturing the semiconductor devices of the embodiments need not use a release film as described above. For example, the semiconductor devices of the embodiments may be manufactured by the well-known transfer mold method, in which a release film is not used.

INDUSTRIAL APPLICABILITY

According to the present invention, heat dissipation characteristic of a semiconductor device in which a semiconductor chip is flip-chip mounted is improved.

The invention claimed is:
1. A semiconductor device comprising:
a substrate;
a semiconductor chip mounted on the substrate face down; and
a sealing resin layer operative to seal the semiconductor chip, wherein
the back surface of the semiconductor chip is exposed through the sealing resin and is convex with respect to the upper surface of the sealing resin layer, and
a step difference is provided in the upper surface of the sealing resin layer, and a gutter is formed in the sealing resin layer in the neighborhood of the semiconductor chip.

2. The semiconductor device according to claim 1, wherein the upper surface of the sealing resin layer in the neighborhood of the semiconductor chip is higher than the upper surface of the sealing resin layer around.

3. A method of manufacturing a semiconductor device, comprising:
   flip-chip mounting a semiconductor chip face down on a substrate provided with a wiring pattern; and
   filling a space formed between an upper die and the substrate with a sealing resin while the upper die is pressed against a lower die carrying the substrate, the upper die being formed such that a chip contact surface, which come into contact with the back surface of the semiconductor chip in molding a resin, is concave with respect to a resin molding surface located around the chip contact surface, wherein
   an upper die, in which a step difference is provided in the resin molding surface, is used in the filling step.

4. A semiconductor device comprising:
   a substrate;
   a semiconductor chip mounted on the substrate face down; and
   a sealing resin layer operative to seal the semiconductor chip, wherein
   the back surface of the semiconductor chip is exposed through the sealing resin, the back surface of the semiconductor chip is concave with respect to the upper surface of the sealing resin layer, and a gutter with a bottom lower in level than the back surface of the semiconductor chip is provided in the sealing resin layer in the neighborhood of the semiconductor chip.

5. The semiconductor device according to claim 4, wherein the upper surface of the sealing resin layer and the back surface of the semiconductor chip are of the same height.

6. The semiconductor device according to claim 5, wherein a step difference is provided on the upper surface of the sealing resin layer outside an area where the gutter is formed.

7. The semiconductor device according to claim 4, wherein a step difference is provided on the upper surface of the sealing resin layer outside an area where the gutter is formed.

8. The semiconductor device according to claim 7, wherein the upper surface of the sealing resin layer in the neighborhood of the semiconductor chip is higher than the upper surface of the sealing resin layer around.

9. The semiconductor device according to claim 4, wherein a step difference is provided on the upper surface of the sealing resin layer outside an area where the gutter is formed.

10. A method of manufacturing a semiconductor device, comprising:
    flip-chip mounting a semiconductor chip face down on a substrate provided with a wiring pattern; and
    filling a space formed between an upper die and the substrate with a sealing resin while the upper die is pressed against a lower die carrying the substrate, the upper die being provided with a chip contact surface, which is adapted to come into contact with the back surface of the semiconductor chip, and with a resin molding surface located around the chip contact surface and adapted to mold a sealing resin layer,
    wherein an upper die, in which a gutter formation part is provided in the resin molding surface in the neighborhood of the chip contact surface and in which the chip contact surface is at a height between the height of the major surface of the resin molding surface outside the gutter formation part and the height of the upper surface of the gutter formation part, is used in the filling step.

11. The method according to claim 10, wherein an upper die, in which the chip contact surface is at a height equal to that of the major surface of the resin molding surface outside the gutter formation part, is used in molding a sealing resin.

12. A method of manufacturing a semiconductor device, comprising:
    flip-chip mounting a semiconductor chip face down on a substrate provided with a wiring pattern; and
    supplying a resin while an upper die is pressed against a lower die, the upper die being provided with a resin molding surface, and the lower die carrying a substrate and a movable die movable within a through hole in the upper die in a direction in which the upper die is opened or closed, wherein
    the movable die is provided with a chip contact surface adapted to come into contact with the back surface of the semiconductor chip, a gutter formation part provided outside the chip contact surface and in the neighborhood thereof for formation of a gutter, and a step difference formation part provided outside the gutter formation part and in the neighborhood thereof.

* * * * *